SOLID-STATE OPTICAL RING COUNTER EMPLOYING ELECTROLUMINESCENT AND PHOTOCONDUCTIVE ELEMENTS

Filed Dec. 3, 1959

INVENTORS
ALAN J. HEEGER
THOMAS R. NISBET
By George Sullivan
Agent

United States Patent Office 3,087,067
Patented Apr. 23, 1963

3,087,067

SOLID-STATE OPTICAL RING COUNTER EMPLOYING ELECTROLUMINESCENT AND PHOTOCONDUCTIVE ELEMENTS

Thomas R. Nisbet, Palo Alto, and Alan J. Heeger, Berkeley, Calif., assignors to Lockheed Aircraft Corporation, Burbank, Calif.

Filed Dec. 3, 1959, Ser. No. 857,164
2 Claims. (Cl. 250—209)

This invention relates generally to counting devices, and more particularly to an optical solid-state ring counter employing electroluminescent and photoconductive elements as circuit components.

It is well known that optical phenomena can potentially be combined with electronic circuitry to provide a wide variety of electronic circuit functions now obtained using only conventional electronic components. Perhaps one of the most attractive features to be obtained by combining the field of optics with electronic circuitry is the possibility of achieving a high degree of microminiaturization using relatively low cost optical components. Although the potential of this combination of optics and electronic circuitry has been known for some time, the lack of suitable materials and techniques has prevented the development of practical circuitry.

Accordingly, it is the broad object of this invention to provide combined optical and electronic circuitry which is adaptable for practical use with present day materials.

Another object of this invention is to provide a new type of combined optical and electronic circuit employing electroluminescent and photoconductive elements as circuit components.

A more specific object of this invention is to provide an optical solid-state ring counter employing electroluminescent and photoconductive elements as circuit components.

An additional object of this invention is to provide devices in accordance with the aforementioned objects which are capable of being made in simple and compact form at relatively low cost.

In accordance with this invention, a plurality of electroluminescent and photoconductive elements are constructed and arranged to provide operation as an optical ring counter. In a typical embodiment, a plurality of optically-coupled bistable stages are provided in a predetermined sequence, each of which comprises an electroluminescent element in series with a photoconductive element and optically-coupled thereto by an amount which will produce bistable operation of the stage when an energization voltage is applied. The stages are connected so that the energizing voltage is switched between first and second groups of alternate stages of the sequence in response to each applied pulse to be counted. The physical arrangement of the stages is such that an initially luminescent electroluminescent element is cause to illuminate both its series-connected photoconductive element and the photoconductive element of the next adjacent stage. The result is that because of the bistable operation of each stage and the optical coupling provided between stages, the switching of the energization voltage between the first and second groups of alternate stages causes the particular electroluminescent element which is luminescent to jump from stage to stage in accordance with the number of pulses applied, the location of the luminescent electroluminescent element thereby indicating the resultant count of the counter. The specific nature of the invention, as well as other objects, uses and advantages thereof, will clearly appear from the following description and from the accompanying drawing in which:

Like numerals designate like elements throughout the figures of the drawing.

Figure 1:
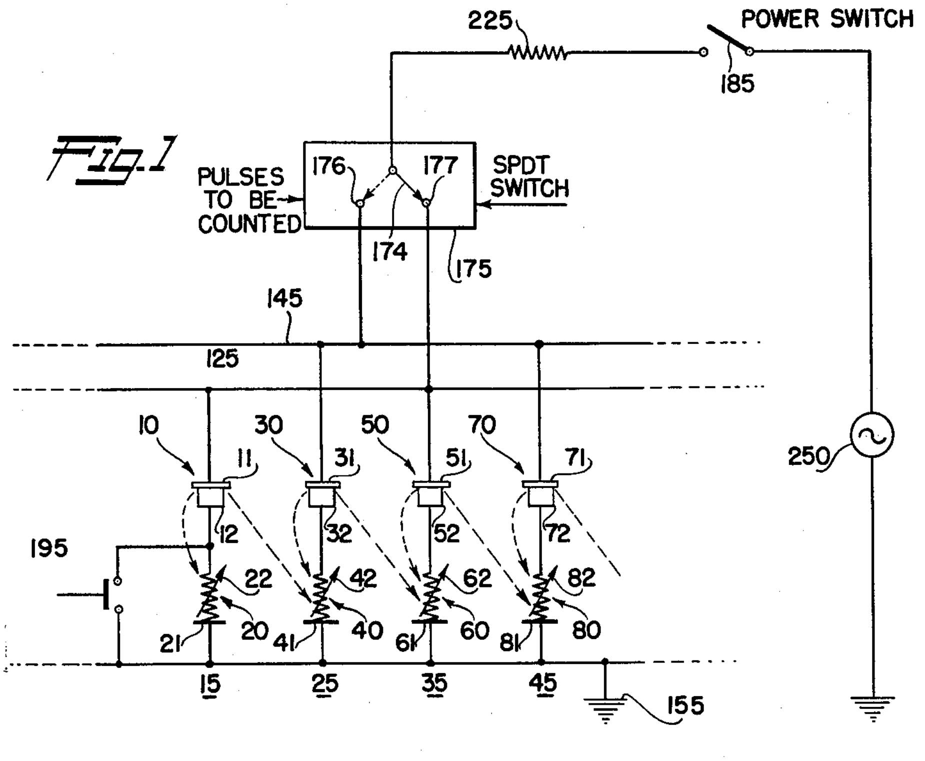
FIGURE 1 is a schematic and circuit diagram of an optical solid-state ring counter employing electroluminescent and photoconductive elements as circuit components, in accordance with the invention.

In FIGURE 1, a plurality of optically-coupled counter stages are provided in a predetermined sequence, as indicated by the numerals 15, 25, 35 and 45. Each stage comprises an electroluminescent element in series with a photoconductive element. Although only four exemplary stages of the sequence are shown in FIGURE 1, it is to be understood that any desired number of stages can be provided.

More specifically, it can be seen in FIGURE 1 that stage 15 has an electroluminescent element 10 in series with a photoconductive element 20, stage 25 has an electroluminescent element 30 in series with a photoconductive element 40, stage 35 has an electroluminescent element 50 in series with a photoconductive element 60, and stage 45 has an electroluminescent element 70 in series with a photoconductive element 80. The stages are constructed and arranged so that when an electroluminescent element is luminescent it illuminates its series connected photoconductive element, and also illuminates the photoconductive element of the adjacent stage, as indicated by the dashed arrows.

Two energizing leads 125 and 145 are provided for the stages of FIGURE 1. The stages 15, 25, 35 and 45 as well as other stages which may be employed are divided into two groups of alternate stages, one group being connected to the lead 125 and the other group being connected to the lead 145. The other ends of the stages 15, 25, 35 and 45 are all connected to circuit ground as shown. Thus, for these exemplary stages 15, 25, 35 and 45, stages 15 and 35 are connected to the energizing lead 125 while stages 25 and 45 are connected to the energizing lead 145. These energizing leads 125 and 145 are then respectively connected to opposite terminals 176 and 177 of a single-pole double-throw switch 175. The movable arm 174 of the switch 175 is connected to one side of an A.-C. voltage source 250 through a resistor 225 and a power switch 185. The other side of the source 250 is connected to circuit ground, as is one end of each of the stages 15, 25, 35 and 45. As the movable arm 174 of the switch 175 is switched between its two terminals 176 and 177, therefore, the voltage output of the A.-C. voltage source 250 is alternately applied to the energization leads 125 and 145, thereby being alternately applied to the two groups of alternate counter stages.

It is to be understood that the switch 175 may be of any suitable type, either mechanical of electronic, and is adapted to be triggered by the input pulses to be counted. Such switches are well known in the art and can readily be provided.

A momentary switch 195 is provided across the photoconductive element 20 of stage 15 to return the counter setting to a reference stage as will hereinafter be described. As was the case with the switch 175, the momentary switch 195 may readily be provided in any desired form, either mechanical or electronic.

It is well known in the art that the combination of an electroluminescent element and a photoconductive element in series therewith, may be so constructed and arranged by adjusting the optical coupling therebetween, so that when an energizing voltage is applied thereacross, a condition is produced whereby the circuit will be bistable. That is, when the radiation incident on the photoconductive element is below some predetermined level the electroluminescent element will remain dark. However, when the incident radiation is above this predetermined level, regenerative action takes place due to the optical coupling between the electroluminescent and photoconductive elements, causing the light output of the electroluminescent element to rapidly build up to a saturation value, and will remain at this value even when the incident radiation is removed. (This type of bistable operation is discussed in Patent No. 2,818,511, column 3, lines 27–65.) The level of brightness attained by an electroluminescent element in a bistable circuit is known as its saturation value.

In accordance with the present invention the series-connected electroluminescent and photoconductive elements of each stage are constructed and arranged in conjunction with the magnitude of the energizing voltage and the resistor 225 to produce the bistable operation described above. This bistable operation of each stage is a most important feature of the invention and makes possible the novel ring counter operation obtained, as will hereinafter become evident. In the absence of a predetermined level of incident radiation on the photoconductive element of a particular stage, therefore, the electroluminescent element of that stage will be dark. On the other hand, if the level of incident radiation applied to the photoconductive element of a particular stage is greater than this predetermined level, the light output of the electroluminescent element of that stage will rapidly build up to its saturation value. For the purposes of this description and the appended claims, a stage will be considered "off" when the electroluminescent element is dark, and "on" when the electroluminescent element is luminescent at its saturation brightness value.

As was mentioned previously, the stages are also constructed and arranged so that each electroluminescent element, when luminescent, illuminates not only its series-connected photoconductive element, but also, the photoconductive element of the next adjacent stage. The amount of illumination of the photoconductive element of this adjacent stage by the electroluminescent element of the previous stage is chosen to be at least greater than the predetermined value of incident radiation required to run the stage "on."

With the above description in mind, the operation of the embodiment of FIGURE 1 may now be explained. In order to return the counter to a reference stage, the power switch 185 is first opened for a sufficient time to cause all stages to turn "off," that is, until no electroluminescent elements are luminescent. The switch 175 is then placed with its movable arm 174 in contact with the terminal 177, and the power switch 185 again closed. The momentary switch 195 is now closed, shorting out the high dark impedance of the photoconductive element 20 of stage 15, until the voltage of the A.-C. source 250 thereby applied across the electroluminescent element 10, causes it to build up to its saturation brightness value. When the switch 195 is opened, the stage 15 remains "on." The stage 15, therefore, serves as a reference stage from which ring counter operation will begin. Obviously, any other desired stage may be used as a reference in a similar manner.

With the stage 15 "on," its electroluminescent element 10 will be luminescent, illuminating the photoconductive element 40 of the next adjacent stage 25. The stage 25, however, being connected to the terminal 176 of the switch 175, will not be energized, so that its series electroluminescent element 30 will remain dark and the stage 25 will remain "off."

If in response to an applied pulse to be counted, the movable arm 174 of the switch 175 is switched over to the terminal 176 as indicated by the dashed arrow, the applied voltage from the source 250 will be switched from stages 15 and 35 to stages 25 and 45, turning the stage 15 "off." Because of the inherent delay of photoconductive material to return to its initial high impedance state when incident radiation is removed, the photoconductive element 40 of the stage 25 will remain at a low impedance value for a predetermined amount of time after the illumination from the electroluminescent element 10 is removed upon switching of the variable arm of the switch 175 from terminal 177 to terminal 176. (For all practical purposes, the decay time of an electroluminescent element is relatively small and may be neglected.) The time required for the variable arm 174 of the switch 175 to switch between the terminals 177 and 176 must therefore be made sufficiently shorter than the decay time of the photoconductive elements so that when the movable arm is switched to the terminal 176, the continued low impedance of the photoconductive element 40 of stage 25 permits the electroluminescent element 30 in series therewith to regeneratively build up in brightness to its saturation value. Stage 25 will now be the only stage "on."

If the movable arm 174 of the switch 175 is now switched back to the terminal 177 in response to the application of another pulse which is to be counted, stage 35 will become the only state "on" in the same way as did stage 25. Likewise, when the movable arm 174 is switched to the terminal 176 for a second time, stage 45 will then become the only stage "on." It should be realized that the time between successive switching cycles (that is, the length of time that the switch remains either at the terminal 176 or 177) must be made sufficiently long to permit the photoconductive element of the previous stage to return to its high impedance dark value. This will prevent more than one stage from being "on" at a time. For example, when the movable arm 174 is switched to the terminal 177 in order to turn stage 35 "on," sufficient time must have elapsed for the photoconductive element 20 of stage 15 to have returned to its high impedance dark value to prevent stage 15 from turning "on" again when it is energized along with stage 35. The resistor 225, in series with the energizing source 250, is provided to permit an increase in the rate at which pulses can be counted. If in the above example the photoconductive element had not returned completely to its high dark impedance when the stage 15 is again energized, the resistor 225 can be chosen so that its voltage divider action will tend to prevent stage 15 from turning "on."

It is now evident that as the movable arm 174 of the switch 175 is switched back and forth between the terminals 176 and 177, in response to the applied pulses to be counted, the electroluminescent element which is luminescent advances one stage for each applied pulse. The location of the "on" stage whose electroluminescent element is luminescent thereby indicates the resultant count.

The construction and arrangement of electroluminescent and photoconductive elements which will exhibit the type of operation just described can readily be provided in a variety of ways which will occur to those skilled in the art, based on presently available techniques. A preferred structure adaptable to the embodiment of FIGURE 1 in accordance with this invention is exemplified in FIGURE 2.

Figure 2:
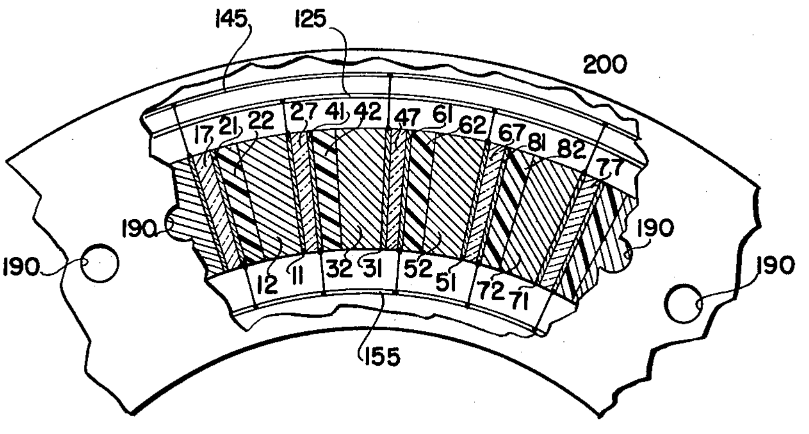
FIGURE 2 is a fragmentary view of a physical embodiment of an optical ring counter in accordance with the invention in which a portion is cut away in order to show a cross-section of the electroluminescent and photoconductive elements.

In FIGURE 2, a fragmentary view of a possible ring counter structure 200 is shown in which a portion is cut away in order to show a cross-section of the electroluminescent and photoconductive elements whoch provide the operation described in accordance with FIGURE 1. In this figure elements are shown which represent corresponding elements of the stages 15, 25, 35 and 45 diagrammatically represented in FIGURE 1, like numerals corresponding to like elements in both figures. For the typical stage 15, for example, a layer of electroluminescent material 12 is provided contiguously with a layer of photoconductive material 22, electrodes 21 and 11 being provided at the opposite ends thereof. These electrodes such as 21 and 11 are preferably provided by depositing transparent conductive material on glass members 17 and 27, respectively, a technique which is well known in the art and has previously been used in connection with electroluminescent and photoconductive devices. These glass members upon which transparent electrodes have been deposited are than interposed between the electroluminescent and photoconductive materials of adjacent stages as shown in FIGURE 2. The electroluminescent material 12 and the photoconductive material 22 interposed between the transparent electrodes 11 and 21 thus correspond to the diagrammatically represented series-connected elements 10 and 20 of stage 15 shown in FIGURE 1. It should be noted at this point that the glass members upon which transparent electrodes have been deposited also function inherently as support elements for both the electroluminescent and photoconductive materials. It will be appreciated by those versed in the photoconductive and electroluminescent art that thin layers of these materials are rather fragile and therefore must be supported by some mechanical arrangement such as that disclosed by the present invention.

Similarly, in FIGURES 1 and 2, the electroluminescent material 32 and the photoconductive material 42 interposed between the transparent electrodes 31 and 41 correspond to the elements 30 and 40 of stage 25, the electroluminescent material 52 and the photoconductive material 62 interposed between the transparent electrodes 51 and 61 correspond to the elements 50 and 60 of stage 35, and the electroluminescent material 72 and the photoconductive material 82 interposed between the transparent electrodes 71 and 81 correspond to the elements 70 and 80 of stage 45.

Also, electrical lead wires 145, 125 and 155 correspond to like designations in FIGURE 1. Means for momentarily shorting the photoconductive material 20 in order to return the counter to a reference stage are not shown in FIGURE 2, but may suitably be provided in any of a number of well known ways. Holes 90 are provided in the structure 200 opposite each electroluminescent area to permit the "on" stage to be visibly determined.

It will now be evident in the construction of FIGURE 2 that, when the electroluminescent material of a stage is luminescent, it illuminates its contiguous photoconductive material which is effectively in series therewith, and in addition, illuminates the photoconductive material of the next adjacent stage as a result of light passing through the respective glass member and its transparent electrodes. The construction of FIGURE 2 will thus permit the required bistable operation of each stage and the necessary optical coupling between stages to be obtained so as to produce the operation described herein.

Since the basic features of this invention reside primarily in the particular electrical circuit of electroluminescent and photoconductive elements employed, and secondarily in the novel constructional arrangement shown in FIGURE 2, particular materials or constructional details will not be given. It is to be understood, however, that the art is sufficiently developed to permit those skilled therein to readily choose suitable electroluminescent and photoconductive materials and other constructional details for the embodiment of FIGURE 2, or other embodiments which may be devised, which will provide the ring counter operation described in connection with FIGURE 1.

It is also to be understood that many modifications and variations are possible without departing from the scope of this invention. For example, a D.-C. energizing source could be used for the A.-C. source 250 if a suitable D.-C. electroluminescent phosphor is used. Also, the embodiment of FIGURE 2 can be arranged in any desired configuration, besides the circular configuration illustrated. The series of elements may end abruptly, or may return on themselves, whichever is desired. The important feature of this invention is the means employed for causing the electroluminescent element which is luminescent to advance from stage to stage so as to indicate the count of the counter.

It will be apparent, therefore, that the embodiments shown and described herein are only exemplary, and that various modifications can be made in construction and arrangement within the scope of the invention as defined in the appended claims.

We claim as our invention:

1. An optical pulse counter comprising a plurality of counter stages arranged in a predetermined sequence contiguously along an arcuate path forming a closed loop, each stage comprising an insulative transparent planar member to support each counter stage and to form an individual unitary element of the counter to enable said counter stages to be supported along said arcuate path, a first transparent conductive layer on said transparent planar member, a layer of photoconductive material on said conductive layer, a layer of electroluminescent material on said photoconductive layer, and a second transparent conductive layer on said electroluminescent layer, said stages being so disposed that the insulative transparent planar member of one stage is in contact with the second transparent conductive layer of the next adjacent stage, an arcuate opaque structure for housing said stages, said housing structure having a plurality of apertures therein, each aperture being disposed opposite a photoconductive layer of one of said stages, means for electrically connecting the first transparent conductive layers of each stage to one another, first and second input terminals, means for connecting the second transparent conductive layer of each alternate stage to said first input terminal, means for connecting the second transparent conductive layer of the other alternate stages to said second input terminal, a power source, and means responsive to pulses to be counted for alternately connecting said power source to said first and second input terminals.

2. An optical counter comprising a plurality of counter stages arranged in a predetermined sequence contiguously along an arcuate path forming a closed loop, each stage comprising an electroluminescent element and a series connected photoconductive element optically coupled thereto, said stages being divided into first and seond groups of alternate stages, each counter stage having at least one insulative planer support member to form an individual unitary element of the counter to enable said counter stages to be supported along said arcuate path, an energizing voltage source, means for switching said energizing voltage source between said first and second groups of alternate stages in response to each pulse to be counted, the electroluminescent and photoconductive elements of each stage being constructed and arranged so that each stage will be bistable when said energizing voltage is applied thereto, said plurality of stages being further constructed and arranged in conjunction with the switching time of said means for switching and the decay time of said photoconductive elements so that when a stage is "on" the light output from its luminescent electroluminescent element sufficiently illuminates the photoconductive element of the next adjacent stage to cause the next adjacent stage to be turned "on" when said energizing voltage source is applied thereto, the electroluminescent element which is luminescent thereby advancing from stage to stage in response to each pulse to be counted, the location of the stage whose electroluminescent element is luminescent determining the resultant count of the counter, and means being additionally provided for first turning "off" all stages and then momentarily shorting out the photoconductive element of a reference stage

References Cited in the file of this patent

UNITED STATES PATENTS

| | | |
|---|---|---|
| 2,727,683 | Allen et al. | Dec. 20, 1955 |
| 2,900,522 | Reis | Aug. 18, 1959 |
| 2,900,574 | Kazan | Aug. 18, 1959 |
| 2,996,622 | Acton | Aug. 15, 1961 |